United States Patent [19]
Hamada et al.

[11] Patent Number: 5,555,521
[45] Date of Patent: Sep. 10, 1996

[54] METHOD OF OPERATING THE SEMICONDUCTOR MEMORY STORING ANALOG DATA AND ANALOG DATA STORING APPARATUS

[75] Inventors: Minoru Hamada, Ogaki; Hitoshi Ando, Gifu-ken, both of Japan

[73] Assignee: Sanyo Electric Co., Ltd, Osaka, Japan

[21] Appl. No.: 489,037

[22] Filed: Jun. 9, 1995

[30] Foreign Application Priority Data

Jun. 14, 1994 [JP] Japan ..................................... 6-132229
Jul. 5, 1994 [JP] Japan ..................................... 6-153942

[51] Int. Cl.$^6$ .............................................. G11C 27/00
[52] U.S. Cl. ................................ 365/185.03; 365/185.29; 365/45
[58] Field of Search ................................. 365/45, 185.03, 365/185.29, 185.18

[56] References Cited

U.S. PATENT DOCUMENTS 4,318,188 3/1982 Hoffmann ........................... 365/185.03
5,294,819 3/1994 Simko ................................. 365/185.03

Primary Examiner—Joseph A. Popek
Attorney, Agent, or Firm—Sheridan Ross & McIntosh

[57] ABSTRACT

The operational method is disclosed, for storing analog data in an electrically programmable and erasable memory cell. The memory cell includes a transistor having a source, a drain, a control gate and a floating gate, where the source, the drain and a channel region therebetween being defined in a semiconductor substrate, the floating gate operating to accumulate charge and being capacitively coupled to the source and the control gate. The method includes the steps of: erasing data in the memory cell, and storing analog data in the memory cell. The erasing step including at least the steps of: i) applying a predetermined first erase voltage to the control gate, ii) applying a ground voltage to the drain to erase the memory cell, wherein charges moved from the channel region are accumulated in the floating gate, thereby erasing data in the memory cell. The storing step including at least the steps of: i) applying a predetermined write voltage to the control gate, ii) applying a voltage corresponding to the analog data to be stored to the drain to write the analog data in the memory cell, whereby charges are moved to the control gate from the floating gate being associated with the analog data to be stored.

14 Claims, 10 Drawing Sheets

$A_{in}$ $S_{in}$ $A_{out}$ $S_{out}$ erase write read erase write

METHOD OF OPERATING THE SEMICONDUCTOR MEMORY STORING ANALOG DATA AND ANALOG DATA STORING APPARATUS

BACKGROUND OF THE INVENTION

1. Field of the Invention

The present invention relates generally to a non-volatile semiconductor memory device which is electrically programmable and erasable. More particularly, the present invention relates to a non-volatile semiconductor memory device having memory cells in which analog data can be stored in and read from.

2. Description of the Related Art

Conventional semiconductor memory device have a plurality of memory cells arranged in an array. Digital data represented by a logic value of "0" or "1" is stored in or read from each of the memory cells.

An analog signal, like an audio signal, changes with the passage of time. Hence, to store or read such an analog signal in or from a conventional semiconductor memory device, an analog/digital converter (A/D converter) and a digital/analog converter (D/A converter) are needed. The A/D converter samples the audio signal at predetermined time intervals, and converts analog data (or analog amounts) corresponding to the sampled audio signal into digital data consisting of a plurality of bits (e.g., 8 bits). The memory device stores the digital data from the A/D converter into memory cells. One memory cell is needed for each bit of each sample. For example, if the A/D converter produces 8-bits of digital data per sample, then eight memory cells would be required for each sample. The (D/A converter) converts the stored digital data to analog data to reproduce the original audio signal. Since a plurality of memory cells are used to store single piece of analog data, the memory device would need to have a very large number of memory cells in order to store an audio signal, particularly if the audio signal is over a long period of time. Further, since the conventional semiconductor memory device requires an A/D converter and a D/A converter, the memory device inevitably becomes larger and its circuit structure becomes complicated.

Memory cells within known non-volatile semiconductor memory device sometimes include a transistor having a floating gate. The threshold value of the transistor varies by removing charges from the floating gate or accumulating charges into the floating gate, so that data represented by "1" or "0" can be electrically written or erased. By utilizing a change in the amount of charges accumulated in or discharged from the floating gate in each memory cell, analog data can be directly and electrically written in or erased from each transistor. When a voltage corresponding to analog data is applied to the transistor at the time of data writing, for example, the amount of charges accumulated in the floating gate changes and the threshold value of the transistor also varies in accordance with this change. The change in threshold value is reflected on the drain current of the transistor at the time of data reading, and the analog data is obtained using the drain current. This approach permits analog data to be stored in one memory cell, so that a compact memory device which does not require many memory cells to store a vast amount of analog data can be utilized. A problem with this approach is that the memory cells of such conventional memory devices tend to have different electrical characteristics. Namely, when the same write voltage is applied to the individual memory cells, the amounts of charges accumulated in the respective floating gates may differ from one another. Hence, the conventional non-volatile memory device cannot store analog data with high precision.

Examined Japanese Patent Publication Nos. 57-1077 and 57-27559 disclose a writing circuit for analog memories. The writing circuit adjusts the write voltage to be applied to the individual memory cells in accordance with the electric characteristics of the memory cells. The writing circuit comprises a first circuit for generating analog data to be written in the memory cells, a second circuit for generating a train of write pulses whose envelope becomes a saw-tooth wave, and a comparator. In writing analog data, the source of a memory cell having a floating gate is opened, and the second circuit applies a write pulse having a peak value according to the analog data generated by the first circuit to the drain with the control gate grounded. After the application of the write pulse, the writing circuit reads analog data from the memory cell, with the source grounded and the control gate and drain supplied with a negative supply voltage. The comparator compares the read analog data and analog data to be written. When both values do not coincide with each other, the second circuit applies a new write pulse having a higher peak value to the associated memory cell. When such writing and reading of analog data are repeated several times and the analog data read from the memory cell coincides with the analog data to be written, the second circuit stops applying a new write pulse to the memory cell. However, if the writing and reading of analog data is repeated several times, it will take an undesirably large amount of time to write analog data into the memory device. Therefore, it is necessary to set the sampling time for analog data longer than the writing time when using the writing circuit with analog memory. The longer sampling times, however, are unsatisfactory when storing analog data like an audio signal that changes continuously.

One known approach to shorten the sampling time for analog data is to use a writing circuit having a sample-and-hold circuit. Such sample-and-hold circuits hold individual pieces of sampled analog data and simultaneously write the pieces of analog data held into the memory device. By providing the sample-and-hold circuit, the apparent writing time is reduced, but at the price of an increased occupying area of the sample-and-hold circuit in the memory device. The increased occupying area in effect reduces the number of memory cells within the memory device, thereby inevitably shortening the recording time of analog data in the memory device. The circuitry required to simultaneously write analog data held by the sample-and-hold circuit becomes complex. Furthermore, the circuitry required to alternately switch the writing and reading operations in order to repeat the writing and reading in the writing circuit becomes complicated and also enlarges the memory device.

Thus, there is a need for a non-volatile semiconductor memory device that is not only programmable and erasable, but also capable of writing analog data very rapidly and with high precision.

SUMMARY OF THE INVENTION

Broadly speaking, the present invention relates to a non-volatile semiconductor memory device that is electrically programmable and erasable, requires less time to write analog data, and has a high storage precision. The various embodiments of the invention discussed below can be implemented as either an apparatus or a method, regardless of how described.

A first embodiment of the invention pertains to an operational method for storing analog data in an electrically programmable and erasable memory cell. The memory cell comprises a transistor having a source, a drain, a control gate and a floating gate, where the source, the drain and a channel region therebetween being defined in a semiconductor substrate, the floating gate operating to accumulate charge and being capacitively coupled to the source and the control gate. The method includes the steps of: erasing data in the memory cell, and storing analog data in the memory cell. The erasing step including at least the steps of: i) applying a predetermined first erase voltage to the control gate, ii) applying a predetermined second erase voltage to the source, and iii) applying a ground voltage to the drain to erase the memory cell, wherein charges moved from the channel region are accumulated in the floating gate, thereby erasing data in the memory cell. The storing step including at least the steps of: i) applying a predetermined write voltage to the control gate, ii) applying the ground voltage to the source via a first current limiting element, and iii) applying a voltage corresponding to the analog data to be stored to the drain to write the analog data in the memory cell, whereby charges are moved to the control gate from the floating gate, and an amount of charges remaining in the floating gate being associated with the analog data to be stored.

The method of the first embodiment may also include the step of reading stored analog data from the memory cell. The reading step includes at least the steps of: i) applying a predetermined first read voltage to the control gate, ii) applying the ground voltage to the source, and iii) applying a predetermined second read voltage to the drain via a second current limiting element to read the stored data from the memory cell, whereby a voltage corresponding to the stored analog data is output from a node between the drain and the second current limiting element.

A second embodiment of the invention also pertains to an operational method for storing analog data in an electrically programmable and erasable memory cell. The memory cell is constructed as it was in the first embodiment. The first step of the method stores analog data in the memory cell. The storing step includes at least the steps of i) applying a predetermined first write voltage to the control gate, ii) applying a predetermined second write voltage to the source, and iii) applying a ground voltage to the drain to enable the memory cell. The second step of the method compares a first current corresponding to analog data to be stored in the memory cell with a second current flowing in the channel region when the memory cell is enabled. The third step of the method stops applying the first write voltage to the control gate or stopping applying the second write voltage to the source when the first and second currents coincide with each other as determined by the comparing, whereby an amount of charges moved to the floating gate from the channel region is associated with the analog data to be stored, resulting in completion of data writing in the memory cell.

The method of the second embodiment may also include the step of erasing the data from in the memory cell. The erasing step includes at least the steps of i) applying a predetermined erase voltage to the control gate, ii) applying the ground voltage to the source, and iii) applying the ground voltage to the drain to erase the memory cell, whereby charges are transferred to the control gate from the floating gate, thereby erasing data from the memory cell.

As a result of the invention, analog data can be stored to the memory cells in a regular clock period without additional sample-and-hold circuitry and without being effected by any minor differences in the electrical characteristics of the memory cells. Thus, the semiconductor memory device according to the invention is more accurate, faster and requires less die area.

BRIEF DESCRIPTION OF THE DRAWINGS

The present invention, together with objects and advantages thereof, may best be understood by reference to the following description of the presently preferred embodiments together with the accompanying drawings, in which.

DETAILED DESCRIPTION OF THE PREFERRED EMBODIMENTS

First Embodiment

A first embodiment of this invention will be described with reference to FIGS. 1 through 8. According to the first embodiment, this invention is adapted for an audio sound storing and reading apparatus as shown in FIG. 1.

Figure 1:
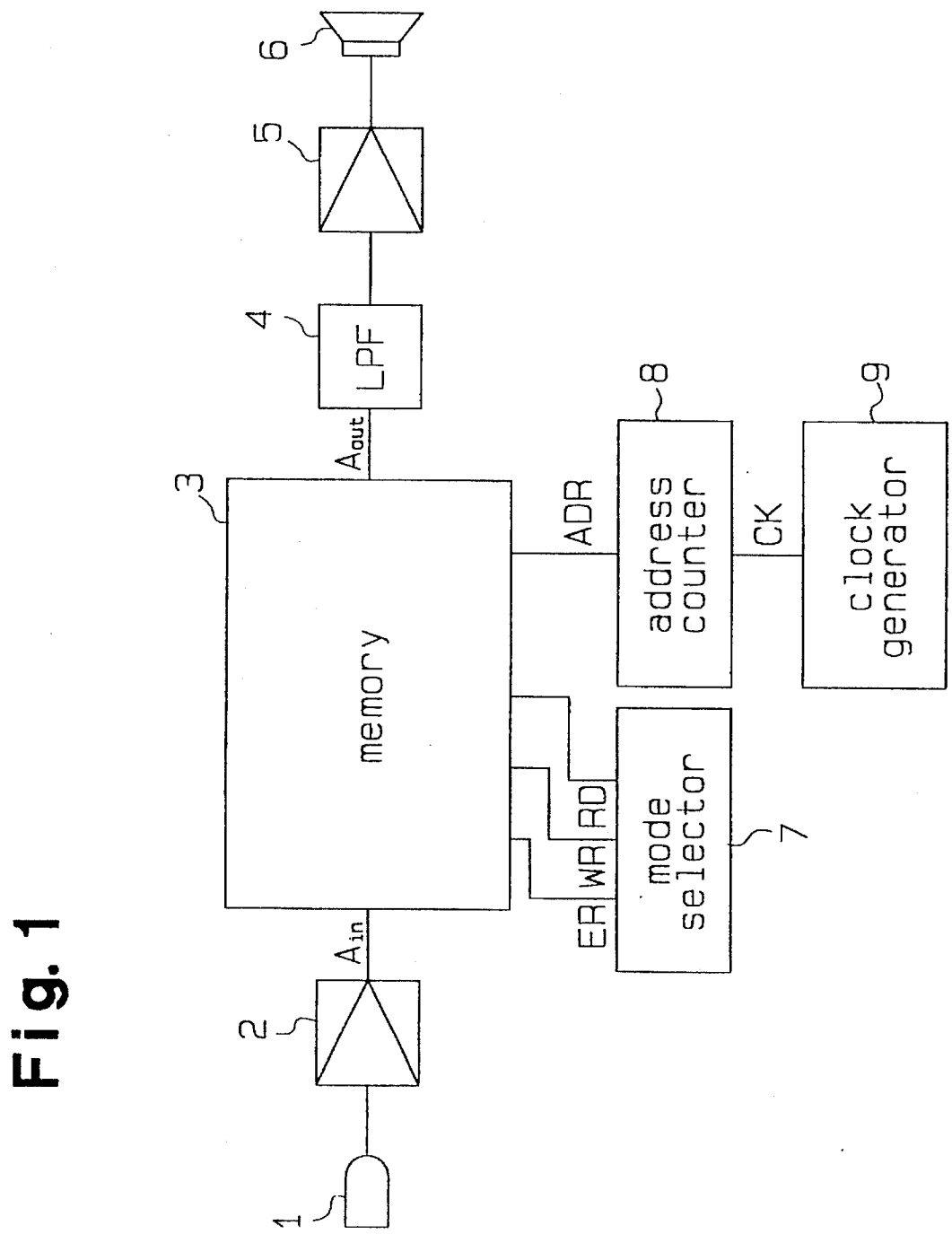
FIG. 1 is a block diagram showing an audio sound storing and reading apparatus.

As shown in FIG. 1, the audio sound storing and reading apparatus comprises a microphone 1, a first amplifier 2, a memory 3, a low-pass filter (LPF) 4, a second amplifier 5, a loudspeaker 6, a mode selector 7, an address counter 8 and a clock generator 9. The microphone 1 receives an audio sound and converts it to an electrical signal, which is in turn output to the first amplifier 2. The first amplifier 2, connected to the microphone 1, receives the electrical signal from the microphone 1, amplifies the electrical signal, and outputs an input signal $A_{in}$ to the memory 3. The memory 3 has a plurality of memory cells. Each of the memory cells stores analog data obtained by sampling the input signal $A_{in}$ at predetermined time intervals. The LPF 4 eliminates the high-frequency component of the analog signal read from the memory 3, and outputs the resultant analog signal to the second amplifier 5. The second amplifier 5 amplifies the resultant analog signal from the LPF 4 and outputs the amplified analog signal to the loudspeaker 6. The loudspeaker 6 converts the analog signal from the second amplifier 5 to an audio sound, and outputs the audio sound.

The mode selector 7, connected to the memory 3, generates various signals according to mode selecting operations performed by a user's manipulating an input device (not shown). The mode selector 7 then outputs each generated signal to the memory 3. More specifically, the mode selector 7 generates one of the signals: a write signal WR according to a write mode for storing an audio signal into the memory 3, a read signal RD according to a read mode for reading an audio signal from the memory 3, and an erase signal ER according to an erase mode for erasing an audio signal stored in the memory 3. The clock generator 9, connected to the address counter 8, generates a clock signal CK with predetermined pulse intervals. The address counter 8, connected to the memory 3, counts the pulses of the clock signal CK from the clock generator 9, produces an address signal ADR for each pulse of the clock signal CK, and sequentially outputs those address signals ADR to the memory 3. In accordance with the input address signal ADR, the row and column of an array of memory cells in the memory 3 are designated to determine a single memory cell.

Figure 2A:
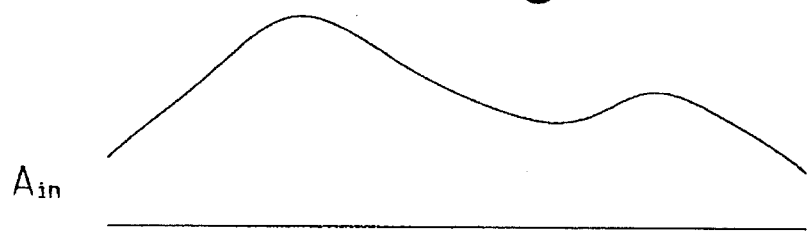
FIG. 2A is a waveform diagram showing an input signal.
Figure 2B:
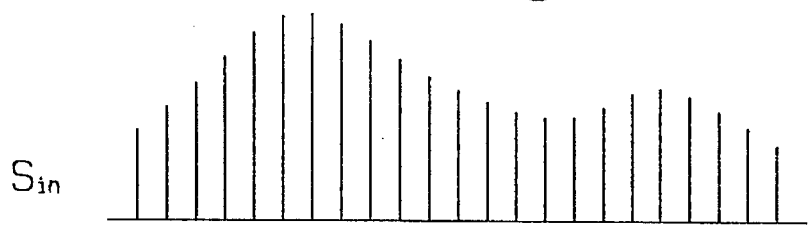
FIG. 2B is a diagram showing sampled analog data to be stored in each memory cell.
Figure 2B:
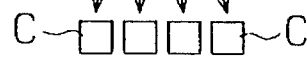
Figure 2B:
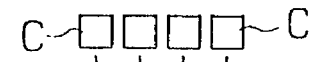
Figure 2C:
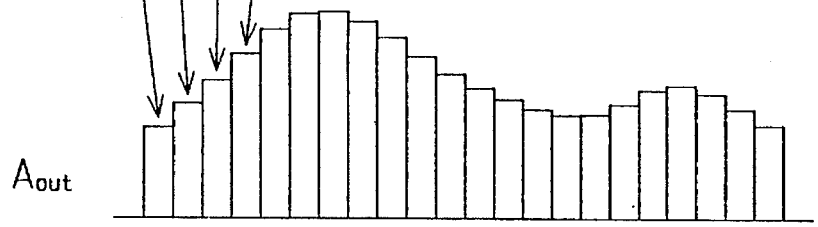
FIG. 2C is a diagram showing output data read from each memory cell.
Figure 2D:
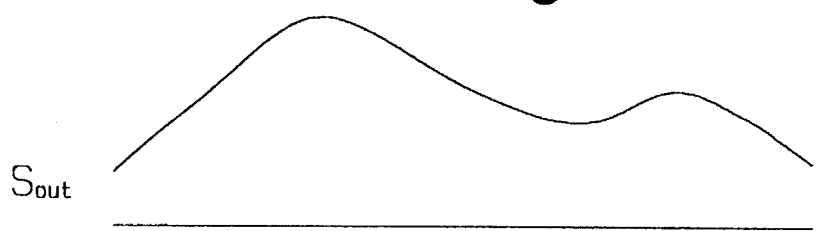
FIG. 2D is a waveform diagram showing an output signal to a loudspeaker.

In the write mode, the memory 3 specifies a single memory cell according to the address signal ADR from the address counter 8 in response to the input write signal WR from the mode selector 7 and stores the input signal $A_{in}$ from the amplifier 2 into the specified memory cell. In accordance with the address signal ADR output from the address counter 8 according to the clock signal CK, the memory 3 samples the input signal $A_{in}$ shown in FIG. 2A at predetermined time intervals as shown in FIG. 2B, and stores the resultant signals as analog sampling values (or sampled analog data values) $S_{in}$ into the associated memory cells C. In the read mode, in response to the read signal RD from the mode selector 7, the memory 3 outputs a plurality of analog sampling values $S_{in}$ which are stored in the memory cells C to the LPF 4 as shown in FIG. 2C. The LPF 4 removes the high-frequency signal components of the analog sampling values $S_{in}$ and outputs the resultant signals as an output signal $S_{out}$ as shown in FIG. 2D to the loudspeaker 6 via the second amplifier 5. In response to the erase signal ER from the mode selector 7, the memory 3 erases the analog sampling values $S_{in}$ stored in the associated memory cells.

Figure 3:
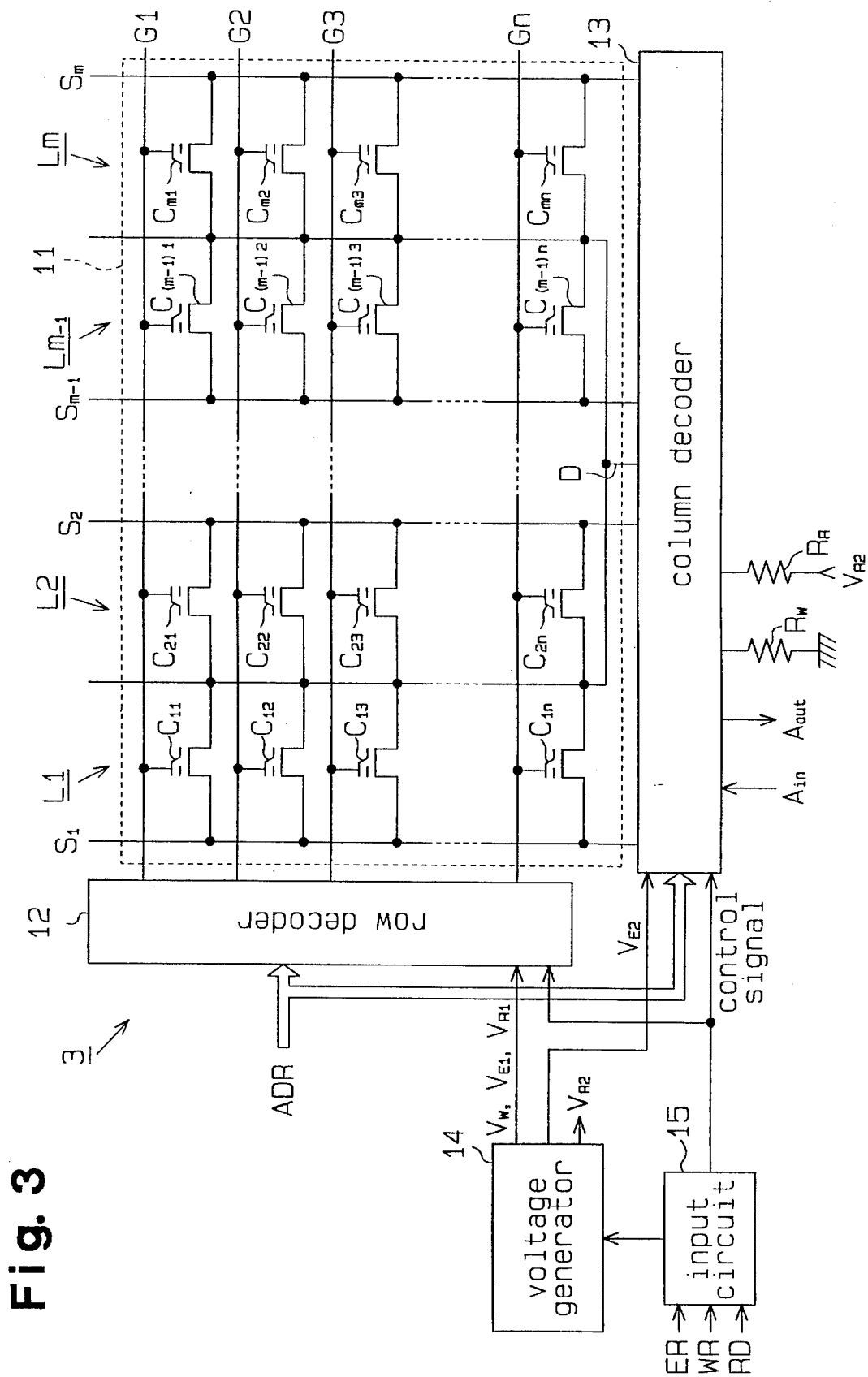
FIG. 3 is a block diagram showing a memory device having a memory cell array in accordance with a first embodiment of the invention.

FIG. 3 shows the non-volatile semiconductor memory device 3 which is electrically programmable and erasable. The memory 3 has a cell array 11, a row decoder 12, a column decoder 13, a voltage generator 14, and an input circuit 15. The cell array 11 has a plurality of memory cells $C_{11}$ to $C_{1n}$, $C_{21}$ to $C_{2n}$, $C_{(m-1)1}$ to $C_{(m-1)n}$ and $C_{m1}$ to $C_{mn}$, source lines $S_1$, $S_2$, $S_{m-1}$ and $S_m$ as a plurality of column address lines, gate lines G1 to Gn as a plurality of row address lines and a drain line D as a common line. Each memory cell has an MOS transistor having a floating gate in which charges whose quantity corresponds to analog data are accumulated, thereby memorizing the associated value. The details of the memory cell will be discussed later.

Each of the memory cells $C_{11}$–$C_{1n}$ in the leftmost column L1 has a drain connected to the common drain line D, a source connected to the source line $S_1$ and a control gate connected to the associated one of the gate lines G1–Gn. Each of the memory cells $C_{21}$–$C_{2n}$ in the next column L2 to the leftmost column L1 has a drain connected to the common drain line D, a source connected to the source line $S_2$ and a control gate connected to the associated one of the gate lines G1–Gn. Likewise, each of the memory cells $C_{(m-1)1}$ to $C_{(m-1)n}$ and $C_{m1}$–$C_{mn}$ in the columns Lm–1 and Lm has a drain, a source and a control gate. The control gates of the uppermost row of memory cells $C_{11}$, $C_{21}$, $C_{(m-1)1}$ and $C_{mn}$ are connected to the gate line G1 and the control gates of the lowermost row of memory cells $C_{1n}$, $C_{2n}$, $C_{(m-1)n}$ and $C_{mn}$ are connected to the gate line Gn.

The row decoder 12, connected to the gate lines G1–Gn, receives the address signal ADR and selects one of a plurality of gate lines in accordance with the address signal ADR. The column decoder 13, connected to the source lines $S_1$, $S_2$, $S_{m-1}$ and $S_m$ and the drain line D, receives the address signal ADR and selects one of a plurality of source lines in accordance with the address signal ADR. The column decoder 13 is connected via a resistor $R_W$ to the ground which is a low-potential power supply. One cell among a plurality of memory cells can be specified by a combination of the selected gate line and the selected source line. The memory cells are specified in order, namely from the memory cell $C_{11}$ to the memory cell $C_{1n}$, and then from the memory cell $C_{21}$ to the memory cell $C_{2n}$. The memory cells $C_{11}$–$C_{1n}$, $C_{21}$–$C_{2n}$, $C_{(m-1)}$–$C_{(m-1)n}$ and $C_{m1}$–$C_{mn}$ are thus continuously specified one after another.

The input circuit 15 is connected to the row decoder 12, column decoder 13 and voltage generator 14. The input circuit 15 receives the write signal WR, the read signal RD and the erase signal ER from the mode selector 7, and outputs control signals corresponding to the received signals to the row decoder 12, the column decoder 13 and the voltage generator 14. The voltage generator 14 is connected to the row decoder 12 and is connected via a resistor $R_R$ to the column decoder 13. The voltage generator 14 receives the control signals from the input circuit 15 and generates a write voltage $V_W$, first and second read voltages $V_{R1}$ and $V_{R2}$, and first and second erase voltages $V_{E1}$ and $V_{E2}$ in accordance with the control signals. The generator 14 outputs the write voltage $V_W$, the first read voltage $V_{R1}$ and the first erase voltage $V_{E1}$ to the row decoder 12, and outputs the second read voltage $V_{R2}$ (via the resistor $R_R$) and the second erase voltage $V_{E2}$ to the column decoder 13.

In the write mode, the row decoder 12 selects one of a plurality of gate lines in accordance with the address signal ADR from the address counter 8 in response to the control signal corresponding to the write signal WR. The row decoder 12 applies the write voltage $V_W$, output from the voltage generator 14, to the selected gate line. Hence, write voltage $V_W$ is applied to the control gates of the memory cells associated with the selected gate line. The column decoder 13 selects one of a plurality of source lines in accordance with the address signal ADR in response to the control signal corresponding to the write signal WR, and connects the selected source line to the ground via the resistor $R_W$. The column decoder 13 also applies the analog voltage of the input signal $A_{in}$ to the drain line D. The resistor $R_W$ may be a constant current resistor constituted of an MOS transistor or a resistor element. If an MOS transistor is used, its resistance against the current flowing across the transistor may not show a linearity in its temperature characteristic.

In the read mode, the row decoder 12 selects one of a plurality of gate lines in accordance with the address signal ADR in response to the control signal corresponding to the read signal RD. The row decoder 12 applies the first read voltage $V_{R1}$, output from the voltage generator 14, to the selected gate line. This first read voltage $V_{R1}$ is applied to the control gates of the memory cells associated with the selected gate line. The column decoder 13 selects one of a plurality of source lines in accordance with the address signal ADR in response to the input control signal corresponding to the read signal RD, and connects the selected source line to the ground (not shown). The column decoder 13 also applies the second read voltage $V_{R2}$ to the drain line D via the resistor $R_R$. The column decoder 13 reads the stored analog data associated with the input signal $A_{in}$ from the memory cell, specified by the selected gate line and the selected source line, and outputs the analog data read as an output signal $A_{out}$ via the drain line D.

In the erase mode, the row decoder 12 selects collectively all the gate lines in response to the control signal corresponding to the erase signal ER, and simultaneously applies the first erase voltage $V_{E1}$ to the control gates of all the memory cells via those selected gate lines. The memory 3 is preferably of a type which selects all the memory cells and collectively erases the analog signals stored in the memory cells in the erase mode. This type of memory can erase data faster than the type which selects a plurality of memory cells one by one and then erases the stored data. Instead of the aforementioned selection of all the memory cells, and then effecting collective erasing, the memory 3 can alternatively be of a type which divides the memory cell array 11 into a plurality of blocks, selects the memory cells block by block and then erases the stored analog signals within the selected block.

Figure 4:
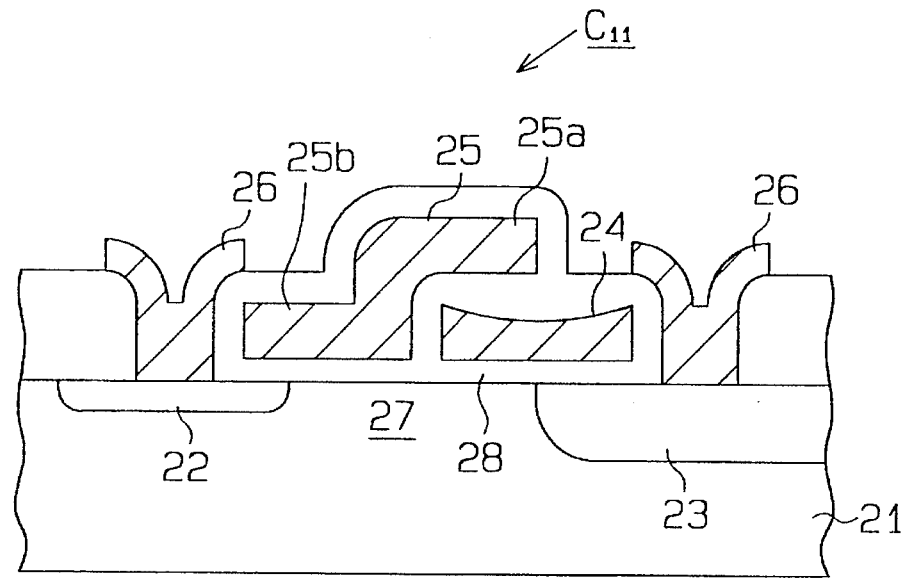
FIG. 4 is a schematic cross-sectional view of an electrically rewritable memory cell.

FIG. 4 is a cross-sectional view showing the memory cell $C_{11}$. As the other memory cells $C_{12}$–$C_{1n}$, $C_{21}$–$C_{2n}$, $C_{(m-1)1}$–$C_{(m-1)n}$ and $C_{m1}$–$C_{mn}$ have the same structure as the memory cell $C_{11}$, their description will be omitted. The memory cell $C_{11}$ has an N type semiconductor substrate 21, and a P type drain region 22 and a P type source region 23 formed in the upper area of the substrate 21. A channel region 27 is formed between the drain region 22 and source region 23. A floating gate 24 is formed on the source region 23 and the channel region 27 via an insulating layer 28. The floating gate 24 is arranged in such a way that one end covers a part of the source region 23 while the other end covers nearly the right half of the channel. The top of the floating gate 24 is recessed so that the edge portion is higher than the center portion. A control gate 25 has a first portion 25a and a second portion 25b. The first portion 25a is arranged so as to cover almost half of the floating gate 24 via the insulating layer 28. The second portion 25b is arranged so as to cover a portion of both the drain region 22 and the channel region 27 via the insulating layer 28 and to be adjacent to the floating gate 24 via the insulating layer 28. Contacts 26 are formed on the drain region 22 and the source region 23. The control gates of the uppermost row of memory cells $C_{21}$, $C_{(m-)1}$ and $C_{m1}$ in the same uppermost row as the memory cell $C_{11}$ is located are mutually connected. The gate line G1 connects the control gates of the uppermost row of memory cells together in this manner. Likewise, the control gates of the memory cells $C_{12}$–$C_{1n}$, $C_{22}$–$C_{2n}$, $C_{(m-1)2}$–$C_{(m-1)n}$ and $C_{m2}$–$C_{mn}$ are connected together row by row, with each of the gate lines G2–Gn connecting the control gates of the associated row of memory cells together. Contacts formed on the source regions of the memory cells $C_{11}$–$C_{1n}$ in the leftmost column which include the contact 26 formed on the source region 23 of the memory cell $C_{11}$ are mutually connected. The source line $S_1$ connects the control gates of the leftmost column memory cells together in this manner. Likewise, contacts formed on the source regions of the memory cells $C_{21}$–$C_{2n}$, $C_{(m-1)1}$–$C_{(m-1)n}$ and $C_{m1}$–$C_{mn}$ are connected together column by column, and each of the source lines $S_2$, $S_{m-1}$ and $S_m$ connects the contacts of the associated column of memory cells. All the contacts formed on the drain regions of the memory cells $C_{11}$–$C_{mn}$ are mutually connected via the drain line D.

The operations of the memory cells in the erase mode, the write mode and the read mode will now be described. Since all the memory cells have the same structure as the memory cell $C_{11}$, they operate in the same manner as the memory cell $C_{11}$. Therefore, the operations of the memory cell $C_{11}$ in each mode will be discussed and the operations of the other memory cells will be omitted.

Erase Mode

Figure 5:
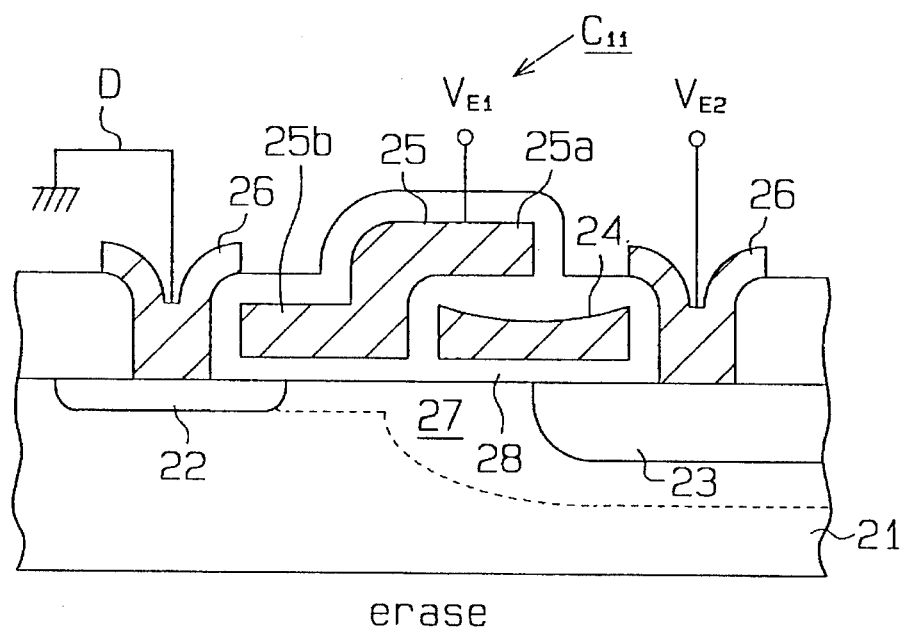
FIG. 5 is a schematic cross-sectional view of a memory cell for explaining operation in an erase mode.

FIG. 5 is a cross-sectional view of the memory cell $C_{11}$ for explaining the operation in erase mode. As mentioned above, the first erase voltage $V_{E1}$ is applied via the gate line G1 to the control gate 25 of the memory cell $C_{11}$ and the second erase voltage $V_{E2}$ is applied via the source line $S_1$ and the contact 26 to the source region 23. The drain region 22 of the memory cell $C_{11}$ is grounded. Given that the first erase voltage $V_{E1}$=+2 V and the second erase voltage $V_{E2}$=+12 V, for example, the floating gate 24 is pulled up to the potential (about 10 V in this embodiment) corresponding to the second erase voltage $V_{E2}$. At this time, the channel region 27 directly below the floating gate 24 is activated (ON state) and the channel region 27 directly below the control gate 25 is slightly activated. As a result, a high electric field is applied to the center portion of the channel region directly below the area between the floating gate 24 and the second portion 25b of the control gate 25 so that the charges at the center portion partially become hot electrons. Those hot electrons are transferred to the floating gate 24 to ensure the supply of the charges. The supply of the charges to the floating gate 24 produces a predetermined resistance between the source region 23 and the drain region 22. In this embodiment, the resistance between the source region 23 and the drain region 22 or the resistance of the memory cell $C_{11}$ when charges are supplied to the floating gate 24 in erase mode is 4 KΩ.

Write Mode

Figure 6:
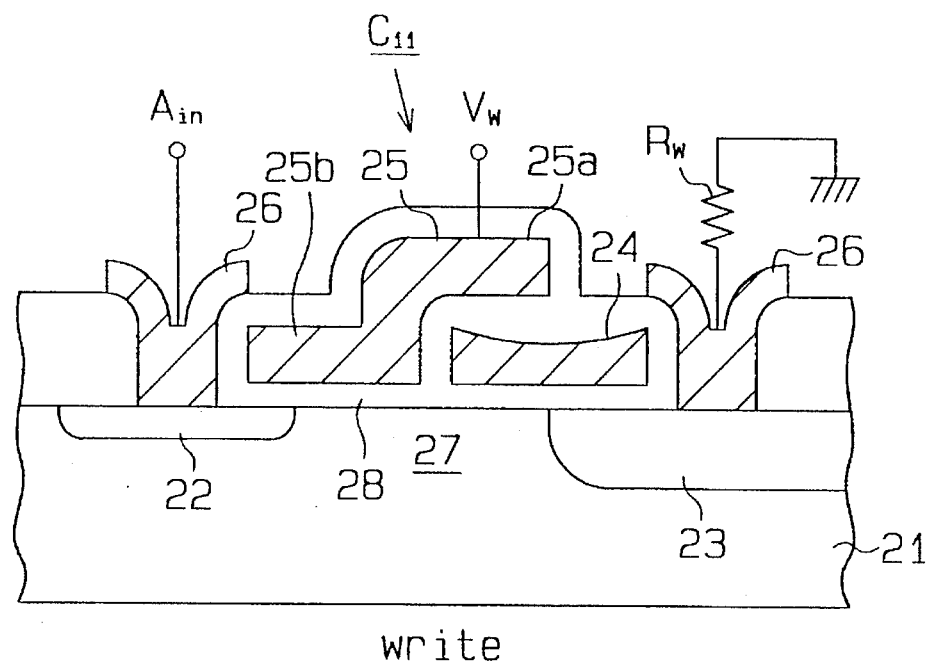
FIG. 6 is a schematic cross-sectional view of a memory cell for explaining operation in a write mode.

FIG. 6 is a cross-sectional view of the memory cell $C_{11}$ for explaining the operation in write mode. After charges are accumulated in the floating gate 24 (or retained by the floating gate 24) in erase mode, the write voltage $V_W$ (+16 V in this case) is applied to the control gate 25 of the memory cell $C_{11}$ and the source region 23 is grounded via the contact 26 and the resistor $R_W$. The analog sampled voltage of the input signal $A_{in}$ to be stored is applied to the drain region 22 of the memory cell $C_{11}$ via the contact 26. At this time, the potential of the source region 23 becomes what is obtained by dividing the analog voltage, applied to the drain region 22, by the resistance of the memory cell $C_{11}$ and the resistance of the resistor $R_W$ connected to the source region 23. The potential $V_S$ of the source region 23 is proportional to the analog voltage $V_d$ and acquired by the following equation (1).

$$V_S = V_d \cdot (R/(R_C + R)) \qquad (1)$$

where $V_d$ is the analog data voltage of the input signal $A_{in}$ to be stored, R is the resistance of the resistor $R_W$, and $R_C$ is the resistance of the memory cell $C_{11}$. As an example, in a case where $V_d$=+5 V, R=1 KΩ and $R_C$=4 KΩ, $V_s$ would be +1 V.

The potential of the floating gate 24 becomes a value proportional to the potential $V_S$ of the source region 23 due to the capacitive coupling between the floating gate 24 and the source region 23. The potential $V_{FG}$ of the floating gate 24 is acquired by the following equation (2).

$$V_{FG}=K \cdot V_S=K \cdot V_d \cdot (R/(R_C+R)) \qquad (2)$$

where K is a coefficient. As K is 2 in this exemplary case, $V_{FG}$ =+2 V if $V_S$=+1 V. The charges accumulated in the floating gate 24 are drawn toward the control gate 25 in accordance with the potential difference ΔV between the potential $V_W$ of the control gate 25 and the potential $V_{FG}$ of the floating gate 24. The drawing of the charges from the floating gate 24 continues until the potential difference ΔV becomes a predetermined value. At this time, the resistance of the memory cell $C_{11}$ decreases. The predetermined value is determined by the degree of the capacitive coupling between the floating gate 24 and the control gate 25. When the potential difference ΔV becomes the predetermined value, the drawing of the charges stops and the memory cell $C_{11}$ is disabled at the same time. The memory cell $C_{11}$ is designed such that the time required for drawing the charge is shorter than one period of the clock signal CK output from the clock generator 9.

For exemplary case, given that the potential difference ΔV when the drawing of charges stops is 13 V, since the potential $V_W$ of the control gate 25 is +16 V and the potential $V_{FG}$ of the floating gate 24 is initially +2 V, the potential difference ΔV becomes 14 V and the charge drawing continues. When the charge drawing continues and the resistance of the memory cell $C_{11}$ decreases, the potential of the source region 23 rises in accordance with the reduction in the resistance. When the potential difference ΔV between the floating gate 24 and the control gate 25 decreases and becomes 13 V due to the rise in the potential of the floating gate 24, the charge drawing stops and simultaneously the memory cell $C_{11}$ is disabled. Since the potential difference ΔV between the floating gate 24 and the control gate 25 is 13 V with the potential $V_W$ of the control gate 25 being +16 V, the potential $V_{FG}$ of the floating gate 24 becomes +3 V. As $V_{FG}$=+3 V, the potential $V_S$ of the source region 23 becomes +1.5 V from the equation (2). The memory cell $C_{11}$ thus has a resistance $R_C$ as given by the following equation (3).

$$R_C=R \cdot ((V_d-V_S)/V_S) \qquad (3)$$

As the potential $V_S$ of the source region 23 is +1.5 V, the analog voltage $V_d$ is +5 V and the resistance R of the resistor $R_W$ is 1 KΩ, the resistance $R_C$ of the memory cell $C_{11}$ becomes about 2.3 KΩ. The resistance $R_C$ of the memory cell $C_{11}$ is determined by the amount of charges remained in the floating gate 24 after the charges are drawn from the floating gate 24. It should be noted that the amount of the remaining charges on the floating gate 24 corresponds to the analog voltage $V_d$.

As another example, when the analog data voltage $V_d$ applied to the drain region 22 is +3 V, the potential $V_S$ of the source region 23 becomes +0.6 V from the equation (1) and the potential $V_{FG}$ of the floating gate 24 becomes +1.2 V from the equation (2). Thus, the potential difference ΔV between the potential $V_W$ of the control gate 25 (=+16 V) and the potential $V_{FG}$ of the floating gate 24 becomes 14.8 V. Since the potential difference ΔV is greater than the potential difference (=13 V) which causes the charge drawing to stop, the charge drawing continues. As the charge drawing continues and the resistance of the memory cell $C_{11}$ decreases, the potential of the source region 23 rises in accordance with the reduction in the resistance. When the potential difference ΔV becomes 13 V, the charge drawing stops. Since the potential $V_{FG}$ of the floating gate 24 becomes +3 V at this time, the potential $V_S$ of the source region 23 becomes +1.5 V. Therefore, the memory cell $C_{11}$ has the resistance $R_C$=1 KΩ from the equation (3).

From the above, when the analog data voltage $V_d$ is +5 V, the resistance $R_C$ of the memory cell $C_{11}$ becomes about 2.3 KΩ, and when the analog data voltage $V_d$ is +3 V, the resistance $R_C$ becomes 1 KΩ. The resistance of the memory cell $C_{11}$ varies in accordance with the analog voltage to be stored. Hence, the floating gate 24, which determines that resistance, accumulates different amounts of charges in accordance with the analog voltage to be stored. That is, resistances of the memory cell $C_{11}$ correspond to different analog voltages.

As described above, the source region 23 of the memory cell $C_{11}$ is grounded via the resistor $R_W$, the analog voltage of the input signal $A_{in}$ is applied to the drain region 22, and the write voltage $V_W$ is applied to the control gate 25. Then, the charges accumulated in the floating gate 24 are drawn toward the control gate 25. The drawing of charge stops when the potential difference between the potential of the control gate 25 and the potential of the floating gate 24 becomes a predetermined value or when charges whose amount corresponds to the analog data are moved to the control gate 25. The charge drawing allows the floating gate 24 to accumulate the charges whose amount corresponds to the analog voltage of the input signal, thereby storing analog data. As a result, it is possible to keep the high precision of storing the input signal, regardless of a variation in the electric characteristics of the individual memory cells. The resistance of each memory cell corresponding to the analog voltage permits each memory cell to directly store the analog data of the input signal corresponding to the audio signal with a simple structure and without requiring an A/D converter. It is also possible to store analog data at a high speed without requiring the circuit which writes the input signal to compare the write voltage with the read voltage.

Read Mode

Figure 7:
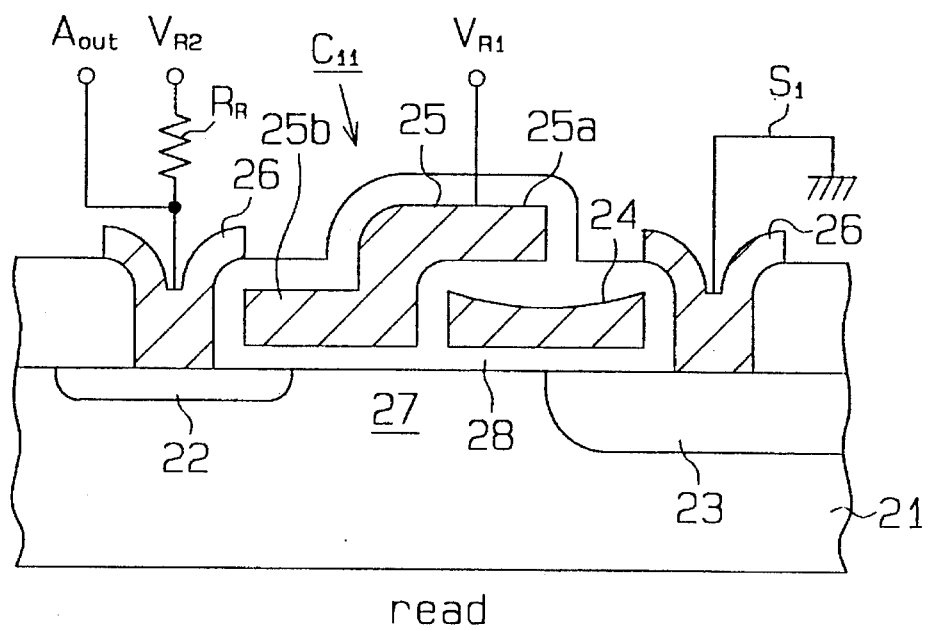
FIG. 7 is a schematic cross-sectional view of a memory cell for explaining operation in a read mode.

FIG. 7 is a cross-sectional view of the memory cell $C_{11}$ for explaining the operation in the read mode. After analog data is stored in the memory cell $C_{11}$ in the write mode, the first read voltage $V_{R1}$ (+4 V in this case) is applied to the control gate 25 of the memory cell $C_{11}$ and the source region 23 is grounded. The second read voltage $V_{R2}$ (+2 V in this case) is applied to the drain region 22 of the memory cell $C_{11}$ via the contact 26 and the resistor $R_R$. Consequently, the memory cell $C_{11}$ outputs the output signal voltage $A_{out}$ corresponding to the stored analog data from the node between the drain region 22 and the resistor $R_R$. The output signal voltage $A_{out}$ is obtained by dividing the second read voltage $V_{R2}$ by the resistance of the resistor $R_R$ and the resistance of the memory cell $C_{11}$. Since the resistance of the memory cell $C_{11}$ corresponds to the analog data stored in the write mode, the output signal voltage $A_{out}$ corresponds to the analog data. Each memory cell having stored analog data in the write mode has a resistance corresponding to sampled analog data. This permits each memory cell to output an output signal voltage $A_{out}$ which corresponds to an analog voltage stored in the write mode. Consequently, it is possible to accurately associate the stored input signal $A_{in}$ with the read output signal $A_{out}$ for each memory cell, regardless of a variation in the electrical characteristics of the individual memory cells.

Operation of Audio Sound Storing/Reading Apparatus

Figure 8:
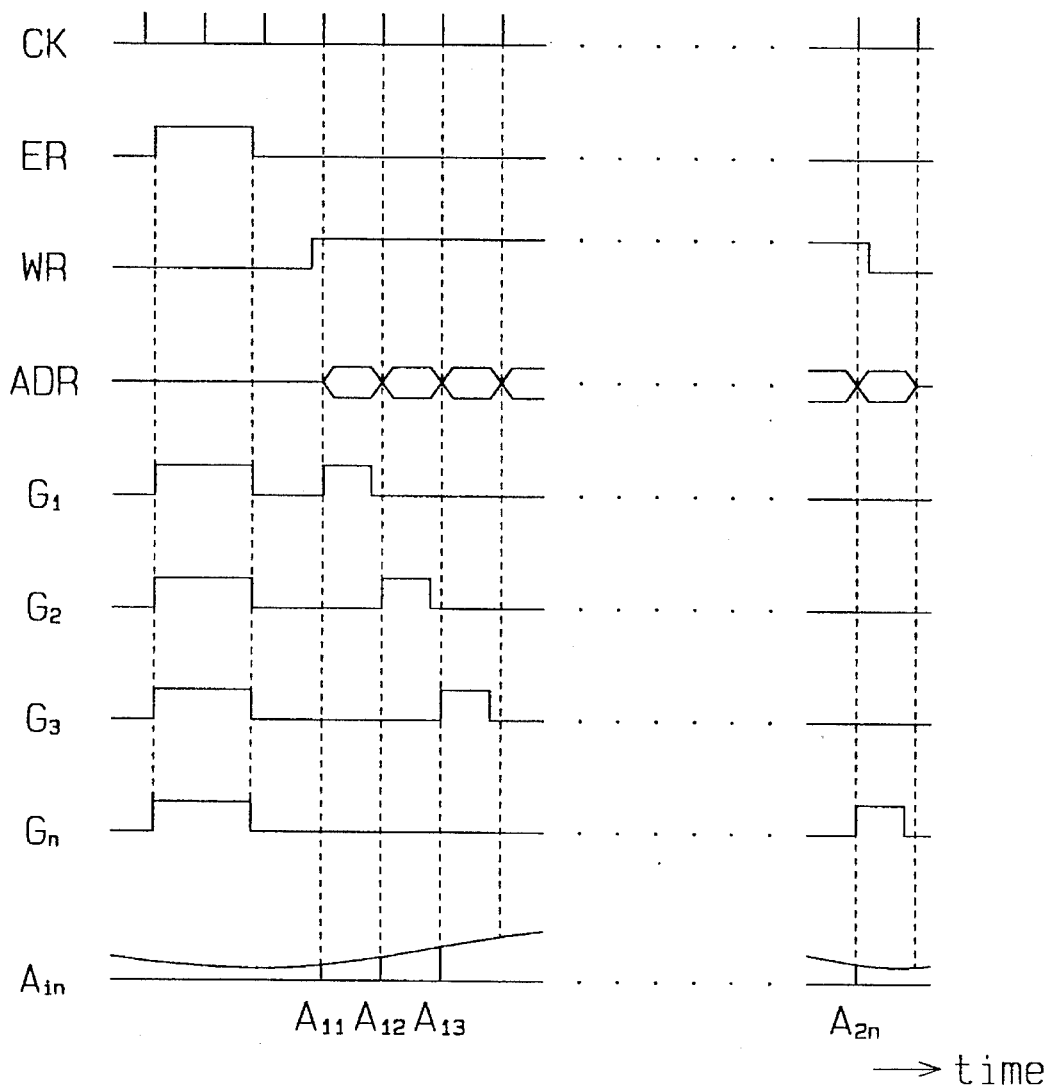
FIG. 8 is a timing chart for explaining the operation of the memory device.

FIG. 8 is a timing chart illustrating operation of the memory device. The operation of the memory device in each of the erase, write and read modes is discussed below.

When the user selects the erase mode using the input device (not shown), the mode selector 7 outputs the erase signal ER corresponding to the selecting operation to the input circuit 15, as shown in FIG. 8. The row decoder 12 and/or the column decoder 13 select all the memory cells in accordance with the control signal corresponding to the erase signal ER from the input circuit 15, apply the first erase voltage $V_{E1}$ to the gate lines G1–Gn and the second erase voltage $V_{E2}$ to the source lines $S_1$, $S_2$, $S_{m-1}$ and $S_m$, and connect the drain line D to the ground. Then, charges are respectively supplied to the floating gates of all the memory cells $C_{11}$–$C_{1n}$, $C_{21}$–$C_{2n}$, $C_{(m-1)1}$–$C_{(m-1)n}$, and $C_{m1}$–$C_{mn}$, thereby enabling all the cells. The erase mode is then terminated.

When the user selects the write mode, the mode selector 7 outputs the write signal WR corresponding to the selecting operation to the input circuit 15. The microphone 1 converts the audio signal to an electrical signal, and the amplifier 2 outputs the input signal $A_{in}$ corresponding to that electrical signal to the column decoder 13. The row decoder 12 and column decoder 13 sequentially select one of the gate lines G1–Gn and one of the source lines $S_1$, $S_2$, $S_{m-1}$ and $S_m$ in accordance with the control signal corresponding to the write signal WR from the input circuit 15 and the address signal ADR from the address counter 8 (see FIG. 8). At this time, the address counter 8 shifts the address signal ADR and outputs it for each pulse of the clock signal CK output from the clock generator 9. First, the column decoder 13 selects the source line $S_1$, connects it to the ground via the resistor $R_W$, and applies the analog sampled voltage value $A_{11}$ of the input signal $A_{in}$ to the drain line D. The row decoder 12 selects the gate line G1 and applies the write voltage to the memory cell $C_{11}$ via the gate line G1. Then, the charges whose quantity corresponds to the analog data voltage $A_{11}$ are drawn from the floating gate 24 of the memory cell $C_{11}$ so that the memory cell $C_{11}$ has the resistance which corresponds to the analog data voltage $A_{11}$. At this time, the charges corresponding to the analog data voltage $A_{11}$ are accumulated in the floating gate 24 of the memory cell $C_{11}$.

In accordance with the transition of the address signal ADR, the row decoder 12 selects the new gate line G2, and applies the write voltage to the control gate 25 of the memory cell $C_{12}$ via the gate line G2. Consequently, the memory cell $C_{12}$, like the memory cell $C_{11}$, has the resistance which corresponds to the potential of the analog sampled value $A_{12}$. At this time, the charges corresponding to the analog data voltage $A_{12}$ are accumulated in the floating gate 24 of the memory cell $C_{12}$. Likewise, the address signal ADR is shifted for each pulse of the clock signal CK, the gate lines G3–Gn are selected in order, the analog data $A_{13}$–$A_{1n}$ are sequentially sampled out from the input signal $A_{in}$, and the potentials corresponding to those sampled values are sequentially applied to the memory cells $C_{13}$–$C_{1n}$. The memory cells $C_{13}$–$C_{1n}$ have resistances which respectively correspond to the analog data voltages $A_{13}$–$A_{1n}$. At this time, the charges corresponding to the individual analog data voltages $A_{13}$–$A_{1n}$ are respectively stored in the memory cells $C_{13}$–$C_{1n}$. After the analog data $A_{1n}$ is stored in the memory cell $C_{1n}$, the column decoder 13 connects the source line $S_2$ to the ground via the resistor $R_W$ in accordance with the transition of the address signal ADR. As a result, the memory cells $C_{21}$–$C_{2n}$, like the memory cells $C_{11}$–$C_{1n}$, sequentially accumulate the charges corresponding to the analog data voltages $A_{21}$–$A_{2n}$ obtained by sampling the input signal $A_{in}$. Once all the analog data of the input signal $A_{in}$ is stored in each memory cell in the above manner, the read mode is terminated.

The transition of the address signal ADR by the address counter 8 in accordance with the clock signal CK permits the gate lines and the source lines to be selected sequentially to store the analog data of the input signal $A_{in}$ in the individual memory cells while sampling the analog data. It is therefore unnecessary to provide a separate sampling circuit. Thus, this simplifies the circuit of the semiconductor memory device, thereby contributing to making the memory device compact.

When the user selects the read mode, the mode selector 7 outputs the read signal RD to the input circuit 15. The row decoder 12 and column decoder 13 sequentially select one of the gate lines G1–Gn and one of the source lines $S_1$, $S_2$, $S_{m-1}$ and $S_m$ in accordance with the control signal corresponding to the read signal RD from the input circuit 15 and the address signal ADR. At this time, the address counter 8 shifts the address signal ADR in accordance with the clock signal CK from the clock generator 9. When selecting the source line $S_1$ first, the column decoder 13 connects it to the ground and applies the second read voltage $V_{R2}$ to the drain line D via the resistor $R_R$. When selecting the gate line G1, the row decoder 12 applies the first read voltage $V_{R1}$ to the gate line G1. The memory cell $C_{11}$ outputs the output signal voltage $A_{out}$ corresponding to its resistance from the node between the drain region 22 and the resistor $R_R$. In accordance with the transition of the address signal ADR, the row decoder 12 selects the new gate line G2, and applies the first read voltage $V_{R1}$ to the control gate 25 of the memory cell $C_{12}$ via the gate line G2. Consequently, the memory cell $C_{12}$, like the memory cell $C_{11}$, outputs the output signal voltage $A_{out}$ corresponding to its resistance. The LPF 4 receives the output signal $A_{out}$ and outputs it to the loudspeaker 6 via the amplifier 5. The loudspeaker 6 in turn converts the output signal $A_{out}$ to an audio sound. When the gate lines G3–Gn are sequentially selected in accordance with the clock signal CK, the individual memory cells output signal voltages $A_{out}$ corresponding to their own resistances. After all the memory cells output their output signal voltages $A_{out}$, the read mode is terminated.

Second Embodiment

Figure 9:
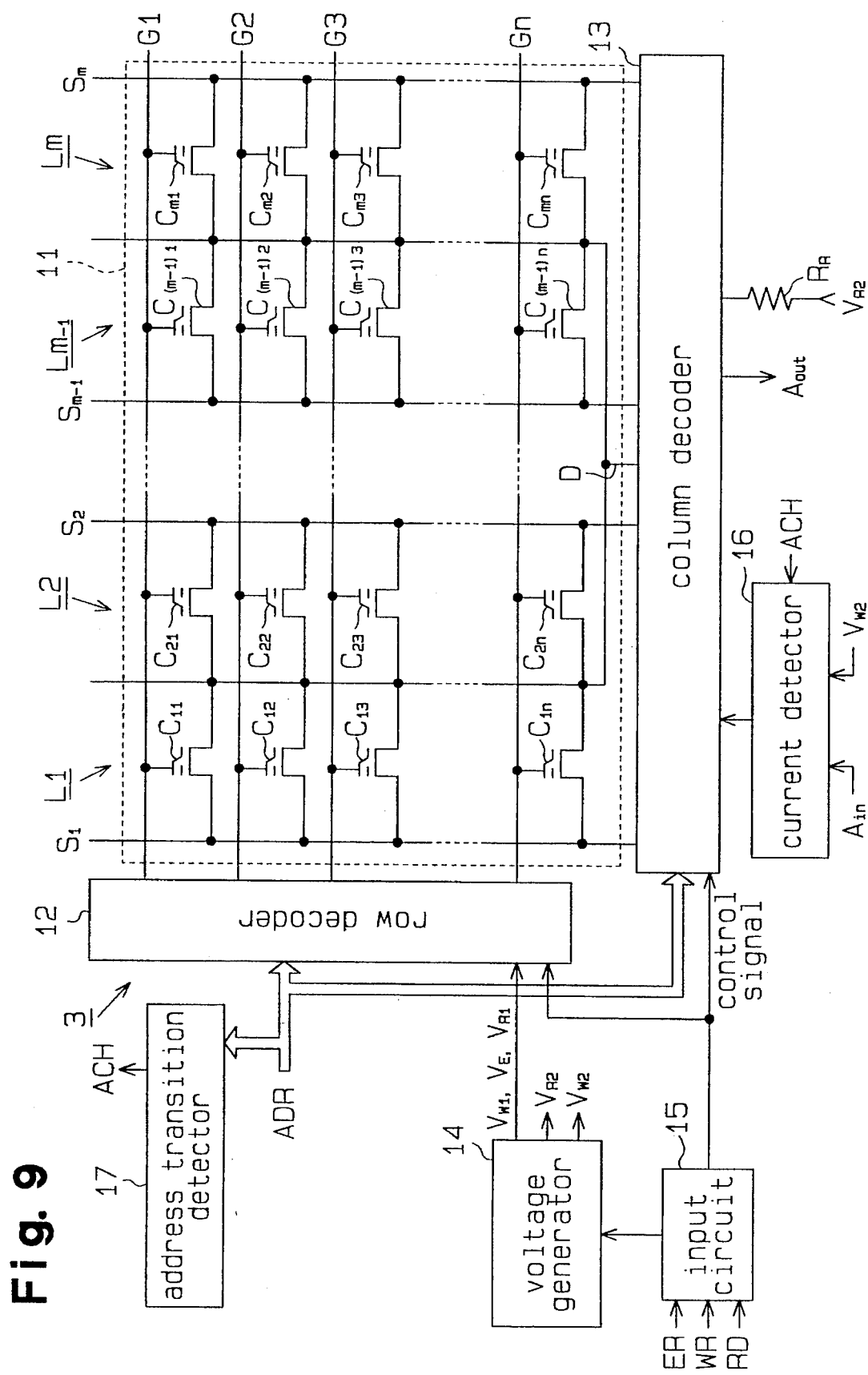
FIG. 9 is a block diagram showing a memory device having a memory cell array in accordance with a second embodiment of the invention.

A second embodiment of this invention will now be described with reference to FIGS. 9 through 12. Same or like reference numerals as used for the first embodiment will be used to denote corresponding or identical components in the second embodiment, and descriptions of such components will not be given again. As shown in FIG. 9, the memory 3 has an address transition detector 17 and a current detector 16 in addition to the memory cell array 11, the row decoder 12, the column decoder 13, the voltage generator 14 and the input circuit 15. The voltage generator 14 produces the first and second write voltages $V_{W1}$ and $V_{W2}$ in accordance with the control signal of the write mode output from the input circuit 15. The voltage generator 14 outputs the first write voltage $V_{W1}$ to the row decoder 12 and outputs the second write voltage $V_{W2}$ to the current detector 16. The address transition detector 17 detects the transition of the address signal based on the address signal ADR output from the address counter 8, and outputs a signal ACH indicative of the detection of the transition to the current detector 16 for a given period of time. The current detector 16, connected between the column decoder 13 and the voltage generator 14, supplies the second write voltage $V_{W2}$ from the voltage generator 14 and the input signal $A_{in}$ to the column decoder 13 in response to the detection signal ACH output from the address transition detector 17. In accordance with the address signal, the column decoder 13 sequentially selects the source line and connects the selected source line to the current detector 16. Then, the decoder 13 applies the second write voltage $V_{W2}$, supplied from the detector 16, to the selected source line. The current detector 16 detects the current which flows to the memory cells via the column decoder 13, and compares the voltage in each memory cell (which is proportional to the detected current) with the analog voltage of the input signal $A_{in}$. The detector 16 keeps supplying the second write voltage $V_{W2}$ to each memory cell until the memory cell voltage matches the input signal voltage $A_{in}$. The detector 16 is designed in such a way that its operation period is shorter than one period of the clock signal CK output from the clock generator 9.

Figure 10:
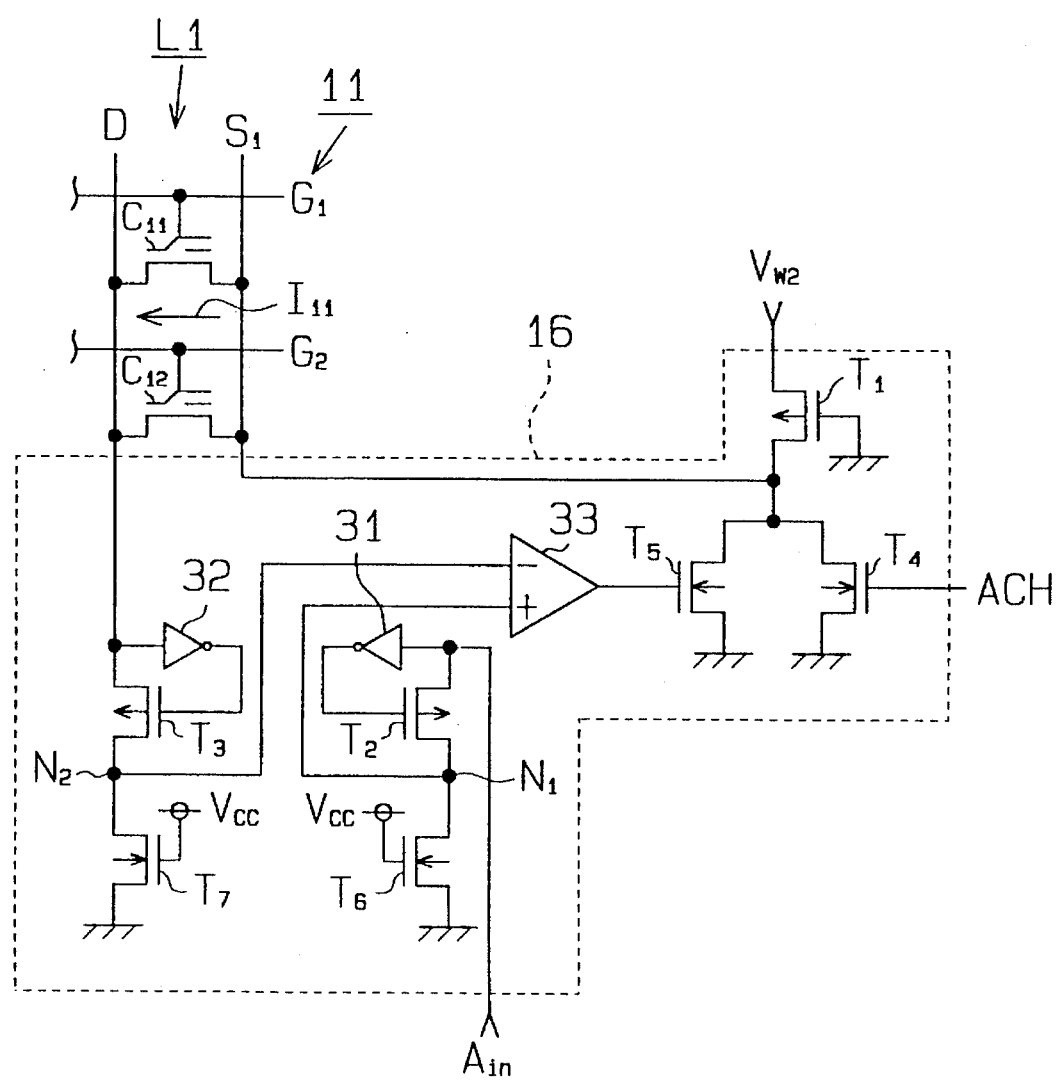
FIG. 10 is a circuit diagram of a current detector used in the memory device shown in FIG. 9.

FIG. 10 presents a circuit diagram of the current detector 16, which is connected to the source line $S_1$, selected by the column decoder 13 in write mode, and the drain line D. The current detector 16 has three P channel MOS transistors $T_1$ to $T_3$, four N channel MOS transistors $T_4$ to $T_7$, two inverter circuits 31 and 32 and a comparator 33. The PMOS transistor $T_1$ has a drain connected via the column decoder 13 to the source line $S_1$, a grounded gate, and a source connected to the voltage generator 14. The PMOS transistor $T_1$ is turned on in response to the write voltage $V_{W2}$ applied to the source. The NMOS transistor $T_4$ has a gate connected between the drain of the PMOS transistor $T_1$ and the ground, and receives the detection signal ACH from the address transition detector 17 at this gate. The transistor $T_4$ is turned on in response to the received detection signal ACH, stopping supplying the second write voltage $V_{W2}$ to the source line $S_1$. This transistor $T_4$ serves to prevent the second write voltage $V_{W2}$ from being abruptly applied to the memory cells when the row decoder 12 switches the gate line in accordance with the address signal ADR.

The PMOS transistor $T_2$ has a source for receiving the input signal $A_{in}$, a drain grounded via the NMOS transistor $T_6$, and a gate connected to its own source via the inverter circuit 31. The PMOS transistor $T_2$ is turned on in response to the received input signal $A_{in}$, and shows a predetermined resistance when turned on. The NMOS transistor $T_6$ has a gate supplied with a predetermined supply voltage $V_{CC}$ (e.g., +5 V). The NMOS transistor $T_6$ is always turned on due to the gate voltage, and shows a predetermined resistance when turned on. The supply voltage $V_{CC}$ is the voltage of the driving power source for the audio sound storing and reading apparatus. Therefore, the potential at a node N1 between the transistor $T_2$ and the transistor $T_6$ is what is obtained by dividing the input signal voltage $A_{in}$ by the ON resistances of the transistors $T_2$ and $T_6$. The PMOS transistor $T_3$ has a source connected via the column decoder 13 to the drain line D, a drain grounded via the NMOS transistor $T_7$, and a gate connected to its own source via the inverter circuit 32. The transistor $T_3$ is turned on in response to a voltage proportional to the current flowing across the drain line D, and shows a predetermined resistance when turned on. The transistor $T_7$ has a gate supplied with a predetermined supply voltage $V_{CC}$ (+5 V). This transistor $T_7$ is always turned on due to the gate voltage, and shows a predetermined resistance when turned on. Therefore, the potential at a node N2 between the transistor $T_3$ and the transistor $T_7$ is proportional to the current flowing across the drain line D. The PMOS transistors $T_2$ and $T_3$ are arranged adjacent to each other and have the same size or same driving performance. The same follows for the NMOS transistors $T_6$ and $T_7$, and the inverter circuits 31 and 32. Therefore, the transistors $T_2$ and $T_3$ have the same electrical characteristics, the transistors $T_6$ and $T_7$ have the same electrical characteristics, and the inverter circuits 31 and 32 have the same electrical characteristics. Because these devices have the same electrical characteristics, when the input signal voltage $A_{in}$ is the same as the drain voltage of the memory cell, the potentials at the nodes N1 and N2 become equal to each other. With the potentials at the nodes N1 and N2 being the same, the current of the same value flows through the transistors $T_2$ and $T_3$. The PMOS transistors $T_1$, $T_2$ and $T_3$ and the NMOS transistors $T_6$ and $T_7$ may be replaced with resistors having predetermined resistances.

The comparator 33 has a positive input terminal connected to the node N1, a negative input terminal connected to the node N2, and an output terminal connected to the gate of the NMOS transistor $T_5$. The NMOS transistor $T_5$ further has a grounded source and a drain connected to the drain of the transistor $T_1$. The comparator 33 compares the potential at the node N1 with the potential at the node N2, and applies a potential corresponding to the comparison result to the gate of the transistor $T_5$. The transistor $T_5$ is turned on or off in response to the potential from the comparator 33. The transistor $T_5$ permits the supply of the second write voltage $V_{W2}$ to the source line $S_1$ when turned off, and stops the supply of the second write voltage $V_{W2}$ to the source line $S_1$ when turned on.

Figure 11:
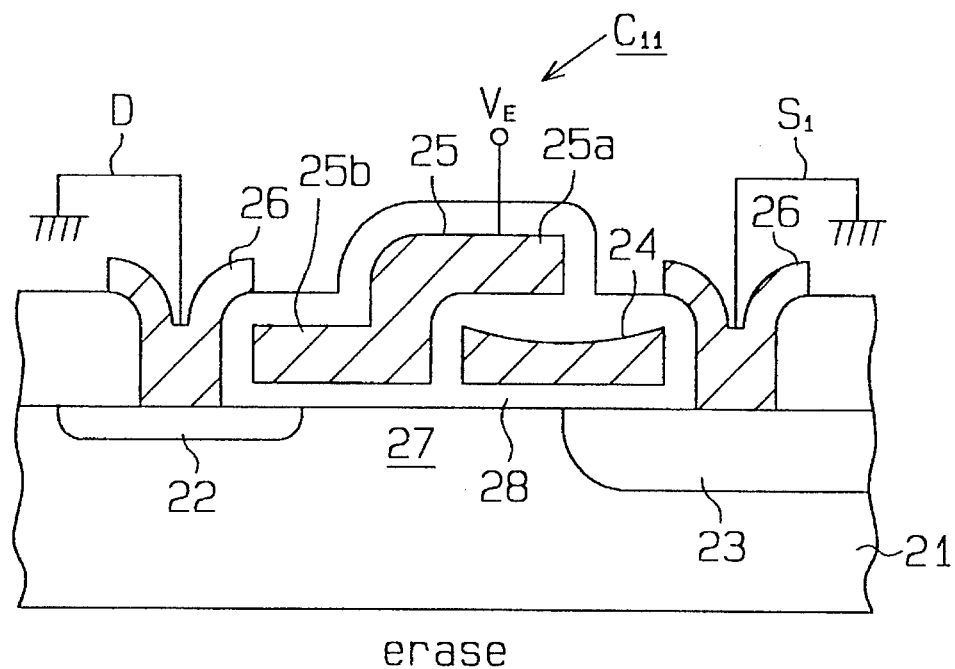
FIG. 11 is a schematic cross-sectional view of a memory cell for explaining operation in an erase mode.

The operation of the second embodiment in the erase mode will now be discussed. In this operation, unlike in the first embodiment, the voltage generator 14 produces the erase voltage $V_E$ in accordance with the control signal corresponding to the write mode output from the input circuit 15, and outputs the erase voltage $V_E$ to the row decoder 12. As shown in FIG. 11, the row decoder 12 applies the erase voltage $V_E$ (+16 V in this case) to the control gate 25 of the memory cell via the selected gate line. The column decoder 13 connects the source region 23 to the ground via the selected source line, and connects the drain region 22 to the ground via the drain line. Then, the charges in the floating gate 24 are moved toward the control gate 25 via the insulating layer 28, so that a tunnel current flows to the source region 23 from the control gate 25 via the floating gate 24. The charges in the floating gate 24 are drawn in this manner.

Figure 12:
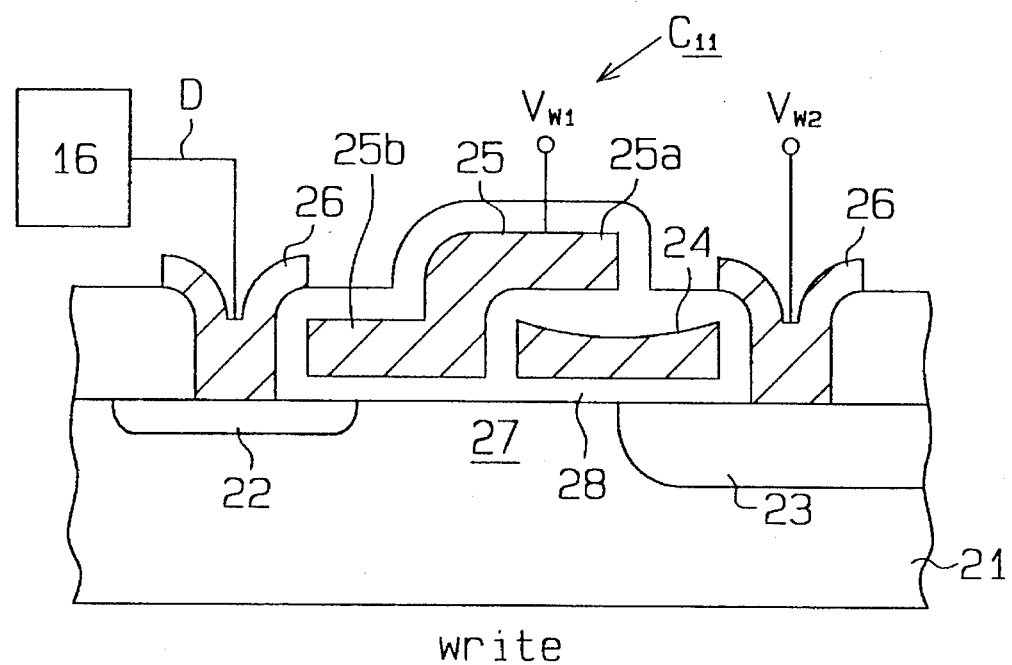
FIG. 12 is a schematic cross-sectional view of a memory cell for explaining operation in a write mode.

The operation of the second embodiment in the write mode will be described below. In accordance with the address signal ADR, the row decoder 12 selects the gate line G1 and the column decoder 13 selects the source line $S_1$, thus defining the memory cell $C_{11}$. As shown in FIG. 12, the first write voltage $V_{W1}$ (+2 V in this case) is applied to the control gate 25 of the memory cell $C_{11}$ and the second write voltage $V_{W2}$ (+12 V in this case) is applied to the source of the memory cell $C_{11}$ via the transistor $T_1$. Further, the drain of the memory cell $C_{11}$ is connected to grounded via the drain line D and the transistors $T_3$ and $T_7$. Consequently, the memory cell $C_{11}$ is enabled and the current $I_{11}$ flows therethrough, raising the potential of the floating gate 24 to the potential corresponding to the second write voltage $V_{w2}$ (about 10 V in this case). At this time, the channel region 27 directly below the floating gate 24 becomes enabled and the channel region directly below the control gate 25 becomes slightly enabled. As a result, a high electric field is applied to the center portion of the channel region directly below the area between the floating gate 24 and the second portion of the control gate 25, so that some of the charges in that portion become hot electrons. Those hot electrons are supplied to the floating gate 24 so that charges are accumulated there.

As charges are being accumulated in the floating gate 24, the resistance between the source and drain of the memory cell $C_{11}$ increases. The increase in the resistance reduces the current $I_{11}$ flowing in the memory cell $C_{11}$. The potential at the node N2 falls in accordance with the reduction in the current $I_{11}$. As charges are being accumulated in the floating gate 24, therefore, the potential at the node N2 falls. This means that the potential at the node N2 indicates the amount of charges accumulated in the memory cell $C_{11}$. The potential at the node N1 becomes a value corresponding to the input signal voltage $A_{in}$. The comparator 33 compares the potential at the node N1 with the potential at the node N2. When both potentials coincide with each other, the comparator 33 applies a potential corresponding to the matched potential to the transistor $T_5$, turning on the transistor $T_5$. Then, the supply of the second write voltage $V_{w2}$ is stopped, thereby disabling the memory cell $C_{11}$. When the potential at the node N1 matches with the potential at the node N2, the amount of charges in the floating gate 24 corresponds to the input signal voltage $A_{in}$. Therefore, the resistance of the memory cell $C_{11}$ becomes a value corresponding to the input signal voltage $A_{in}$. In the above-described manner, the current detector 16 applies the second write voltage $V_{w2}$ to the source of the memory cell $C_{11}$ and writes (or records) the analog data of the input signal $A_{in}$ while accumulating charges in the floating gate 25. At the same time as the analog data is written, the current detector 16 detects the current $I_{11}$ flowing in the memory cell $C_{11}$ (due to the application of the second write voltage $V_{w2}$) in the form of the potential at the node N2, and reads the amount of charges accumulated in the floating gate 24, i.e., the analog voltage of the input signal $A_{in}$. When the potential at the node N1 corresponding to the input signal $A_{in}$ coincides with the potential at the node N2, the current detector 16 stops supplying the second write voltage $V_{w2}$. Therefore, it is possible to keep the high precision of storing analog data, regardless of a variation in the electrical characteristics of the individual memory cells. Further, the simultaneous writing and reading of analog data by the detector 16 allows analog data to be stored at a high speed.

Since the operation of the second embodiment in the read mode is the same as that of the first embodiment illustrated in FIG. 7, its description will be omitted.

Third Embodiment

A third embodiment of this invention will now be described with reference to FIG. 13. Same or like reference numerals as used for the first and second embodiments will be used to denote corresponding or identical components in the third embodiments to avoid repeating their descriptions.

Figure 13:
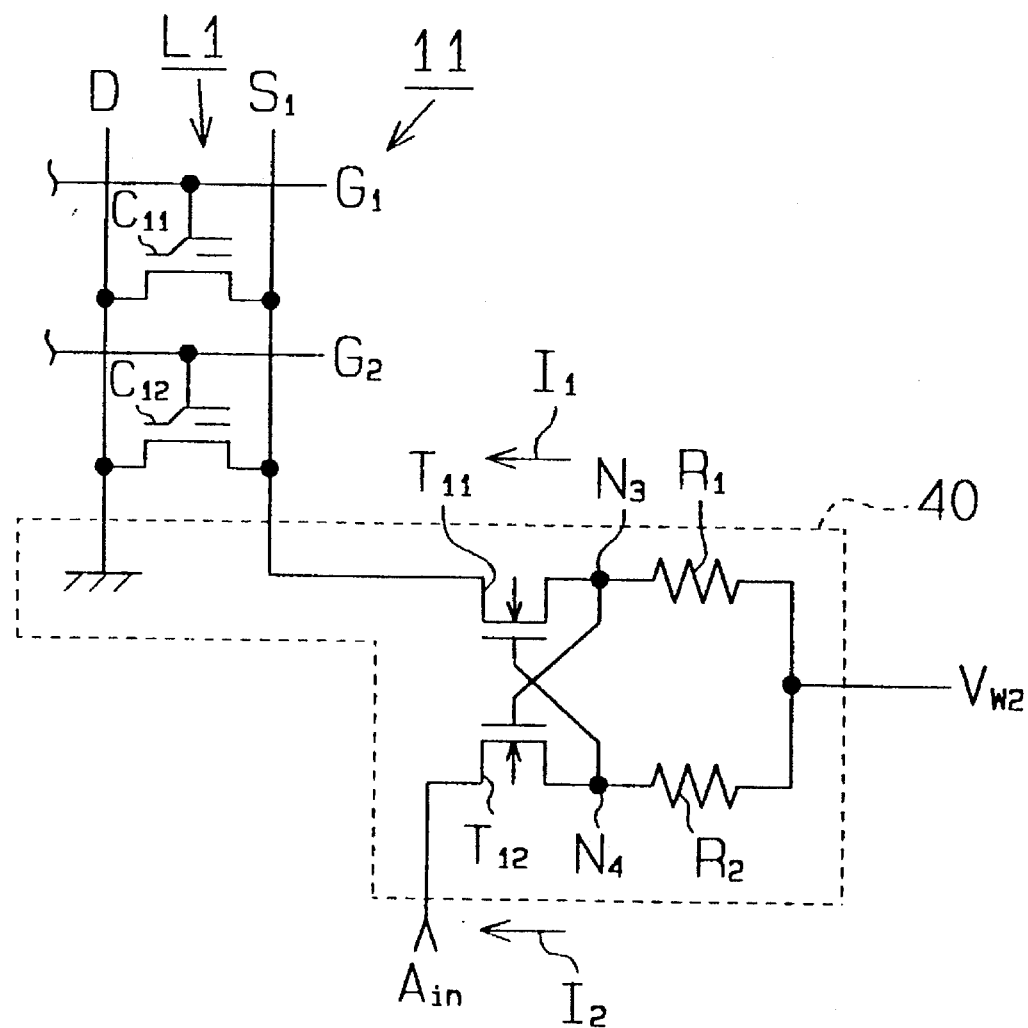
FIG. 13 is a circuit diagram illustrating a current detector used in a memory device in accordance with a third embodiment of the invention.

FIG. 13 presents a circuit diagram of a current detector 40, which is connected to, for example, the source line $S_1$ selected by the column decoder 13 and the drain line D in the read mode. The current detector 40 has two resistors $R_1$ and $R_2$ and two NMOS transistors $T_{11}$ and $T_{12}$. The NMOS transistor $T_{11}$ has a drain connected to the resistor $R_1$ and a source connected to the source line $S_1$ via the column decoder 13. The NMOS transistor $T_{12}$ has a drain connected to the resistor $R_2$ and a source which is supplied with the input signal voltage $A_{in}$. The transistor $T_{11}$ has a gate connected to the drain of the transistor $T_{12}$, and the transistor $T_{12}$ has a gate connected to the drain of the transistor $T_{11}$. The resistors $R_1$ and $R_2$ are connected together. The second write voltage $V_{w2}$ is applied to the node between the resistors $R_1$ and $R_2$. The NMOS transistors $T_{11}$ and $T_{12}$ may be replaced with PMOS transistors.

The operation of the third embodiment in the write mode will now be discussed. Suppose that the operation in the erase mode has already been performed and charges are drawn from the floating gate 24 so that the memory cell $C_{11}$ is enabled. The operation in the erase mode is the same as that in the second embodiment. The resistance of the memory cell $C_{11}$ when turned on is 3 KΩ. The resistors $R_1$ and $R_2$ have resistances of 1 KΩ, and the NMOS transistors $T_{11}$ and $T_{12}$ when turned on have resistances of 1 KΩ. The first write voltage $V_{w1}$ (+2 V in this case) is applied via the selected gate line G1 to the control gate of the memory cell $C_{11}$, the second write voltage $V_{w2}$ (+10 V in this case) is applied to the node between the resistors $R_1$ and $R_2$, and the input signal voltage $A_{in}$ is applied to the source of the transistor $T_{12}$. Further, the drain of the memory cell $C_{11}$ is connected to the ground. As a result, the transistors $T_{11}$ and $T_{12}$ are turned on, currents $I_1$ and $I_2$ corresponding to the input signal $A_{in}$ flow through those transistors. The potential at a node N3 between the resistor $R_1$ and the transistor $T_{11}$ at this time becomes +8 V, which is the value obtained by dividing the second write voltage $V_{w2}$ (+10 V) by the resistances of the resistor $R_1$, the transistor $T_{11}$ and the memory cell $C_{11}$. The potential at this node N3 corresponds to the resistance of the memory cell $C_{11}$ m and increases in accordance with an increase in this resistance (a decrease in the current flowing between the source and drain of the memory cell $C_{11}$). Therefore, the current detector 40 can detect the potential at the node N3 as the current flowing in the memory cell $C_{11}$. The potential at a node N4 between the resistor $R_2$ and the transistor $T_{12}$ becomes what is obtained by dividing the value of potential difference between the second write voltage $V_{w2}$ and the input signal $A_{in}$ by the resistances of the resistor $R_2$ and the transistor $T_{12}$. For instance, when the input signal voltage $A_{in}$ is +8 V, the potential at the node N4 becomes +9 V.

The potential at the node N3 is the gate potential of the transistor $T_{12}$, and the potential at the node N4 is the gate potential of the transistor $T_{11}$. Since the potential at the node N4 is higher than that at the node N3, therefore, the current $I_1$ flowing through the transistor $T_{11}$ is greater than the current $I_2$ flowing through the transistor $T_{12}$. Consequently, most of the second write voltage $V_{w2}$ is applied to the source of the memory cell $C_{11}$. This causes the concentration of an electric field on the channel region directly below the floating gate and the control gate, so that charges are supplied to the floating gate. In accordance with the supply of the charges, the resistance of the memory cell increases. This increase in the resistance of the memory cell raises the drain voltage of the transistor $T_{11}$ or the potential at the node N3, thus reducing the current $I_1$. When the potential at the node N3 becomes higher than that at the node N4, the current $I_1$ becomes smaller than the current $I_2$. As a result, most of the second write voltage $V_{w2}$ is applied to the resistor $R_2$ and the transistor $T_{12}$, thus cutting off the transistor $T_{11}$. The current detector 40 stops applying the second write voltage $V_{W2}$ to the memory cell $C_{11}$ in this manner. Consequently, the memory cell $C_{11}$ stops supplying the charges to the floating gate. At this time, the memory cell $C_{11}$ has the resistance which corresponds to the supplied charges. The resistance of the memory cell $C_{11}$ is the value when the potential at the node N3 becomes higher than the potential at the node N4, and corresponds to the potential at the node N4. The potential at the node N4 corresponds to the input signal voltage $A_{in}$, which indicates that the input signal $A_{in}$ has been stored in the memory cell $C_{11}$. It is therefore possible to keep the high precision of storing the input signal $A_{in}$, regardless of a variation in the electrical characteristics of the individual memory cells. Further, the current detector 40 has a relatively simpler structure than the current detector 16 of the second embodiment.

Although only three embodiments of the present invention have been described herein, it should be apparent to those skilled in the art that the present invention may be embodied in many other specific forms without departing from the spirit or scope of the invention. Particularly, it should be understood that this invention may be embodied in the following forms.

The electrically programmable and erasable non-volatile semiconductor memory device of this invention may be adapted for an apparatus for storing and reproducing various kinds of analog signals besides the discussed audio sound storing and reading apparatus.

The mode selector 7 may selectively switch the mode in accordance with a signal from an external device, instead of by a user. For instance, when a memory device is used to store a vocal message in a telephone set or a facsimile, the mode selector 7 may switch the mode to the erase mode or the read mode as instructed by the user, and may switch the mode to the write mode in accordance with a call signal from a caller's telephone.

Therefore, the present examples and embodiments are to be considered as illustrative and not restrictive, and the invention is not to be limited to the details given herein, but may be modified within the scope of the appended claims.

What is claimed is:

1. An operational method for storing analog data in an electrically programmable and erasable memory cell comprising a transistor having a source, a drain, a control gate and a floating gate, said source, said drain and a channel region therebetween being defined in a semiconductor substrate, said floating gate operating to accumulate charge and being capacitively coupled to said source and said control gate, said method comprising the steps of:

(a) erasing data in said memory cell, said erasing including at least the steps of:
      i) applying a predetermined first erase voltage to said control gate,
      ii) applying a predetermined second erase voltage to said source, and
      iii) applying a ground voltage to said drain to erase said memory cell, wherein charges moved from said channel region are accumulated in said floating gate, thereby erasing data in said memory cell; and
   (b) storing analog data in said memory cell, said storing including at least the steps of:
      i) applying a predetermined write voltage to said control gate,
      ii) applying said ground voltage to said source via a first current limiting element, and
      iii) applying a voltage corresponding to said analog data to be stored to said drain to write said analog data in said memory cell, whereby charges are moved to said control gate from said floating gate, and an amount of charges remaining in said floating gate being associated with said analog data to be stored.

2. The method according to claim 1, further comprising the step of:

(c) reading stored analog data from said memory cell, said reading including at least the steps of:
      i) applying a predetermined first read voltage to said control gate,
      ii) applying said ground voltage to said source, and
      iii) applying a predetermined second read voltage to said drain via a second current limiting element to read said stored data from said memory cell, whereby a voltage corresponding to said stored analog data is output from a node between said drain and said second current limiting element.

3. The method according to claim 2, wherein said voltage output from said node during said reading is proportional to a resistance between said source and said drain of said transistor.

4. An analog data storing apparatus having a non-volatile semiconductor memory which is electrically rewritable and erasable, said apparatus comprising:

a memory cell array having a plurality of row address lines, a plurality of column address lines, a common line and a plurality of memory cells which are selectable by said plurality of row address lines and said plurality of column address lines, each of said memory cells comprising a transistor having a control gate connected to an associated one of said plurality of row address lines, a source connected to an associated one of said plurality of column address lines, a drain connected to said common line, and a floating gate, said floating gate operating to accumulate charge and being capacitively coupled to said source and said control gate;

erasing means for applying a predetermined first erase voltage to one or more of said plurality of row address lines, applying a predetermined second erase voltage to one or more of said plurality of column address lines, and applying a ground voltage to said common line to accumulate charges moved to said floating gate from a channel region between said source and said drain region, thereby erasing data in one or more of said memory cells;

a first current limiting element having one end applied said ground voltage; and writing means for selectively applying a predetermined write voltage to one of said plurality of row address lines, selectively applying said ground voltage to one of said plurality of column address lines via said first current limiting element, and applying a voltage corresponding to said analog data to be stored to said common line, thereby associating an amount of charges remaining in said floating gate with said analog data to be stored.

5. An analog data storing apparatus according to claim 4, further comprising:

a second current limiting element; and reading means for selectively applying a predetermined first read voltage to one of said plurality of row address lines, applying a predetermined second read voltage to said common line via said second current limiting element, and selectively applying said ground voltage to one of said plurality of column address lines, thereby outputting an analog data voltage proportional to a resistance between said source and said drain of said transistor of an associated memory cell from a node between said drain and said second current limiting element.

6. An analog data storing apparatus according to claim 4, wherein said erasing means and said writing means comprise:

a supply voltage generator for generating said predetermined first and second erase voltages in response to a erase control signal and generating said predetermined write voltage in response to a write control signal;

a row address line selector, connected to said supply voltage generator and said plurality of row address lines, for selecting a first plurality of row address lines among said row address lines which are associated with some or all of said plurality of memory cells in response to said erase control signal and applying said first erase voltage to said selected first plurality of row address lines, and selecting one of said plurality of row address lines in response to an address signal and said write control signal and applying said predetermined write voltage to said selected row address line; and a column address line selector, connected to said supply voltage generator, said plurality of column address lines and said common line, for selecting said first plurality of column address lines among said column address lines which are associated with some or all of said plurality of memory cells in response to said erase control signal and applying said second erase voltage to said selected first plurality of column address lines, and selecting one of said plurality of column address lines in response to an address signal and said write control signal, selectively connecting said selected column address line to said first current limiting element, and supplying a voltage corresponding to said analog data to be stored to said common line.

7. An analog data storing apparatus according to claim 5, wherein said reading means includes:

a supply voltage generator, connected to said second current limiting element, for generating said predetermined first and second read voltages in response to a read control signal;

a row address line selector, connected to said supply voltage generator and said plurality of row address lines, for selecting one of said plurality of row address lines in response to an address signal and said read control signal and applying said first read voltage to said selected row address line; and a column address line selector, connected to said supply voltage generator, said plurality of column address lines and said common line, for selecting one of said plurality of column address lines in response to an address signal and said read control signal, selectively connecting said selected column address line to ground, and selectively connecting said second current limiting element to said common line and applying said second read voltage, to said common line via said second current limiting element.

8. An operational method for storing analog data in an electrically programmable and erasable memory cell comprising a transistor having a source, a drain, a control gate and a floating gate, said source, said drain and a channel region therebetween being defined in a semiconductor substrate, said floating gate operating to accumulate charge and being capacitively coupled to said source and said control gate, said method comprising the steps of:

(a) storing analog data in said memory cell, said storing including at least the steps of:
    i) applying a predetermined first write voltage to said control gate,
    ii) applying a predetermined second write voltage to said source, and
    iii) applying a ground voltage to said drain to enable said memory cell; and (b) comparing a first voltage associated with said analog data to be stored in said memory cell with a second voltage associated with a current flowing in said channel region when said memory cell is enabled; and (c) stopping applying said first write voltage to said control gate or stopping applying said second write voltage to said source when said first and second voltages differ by less than a predetermined amount, whereby an amount of charges moved to said floating gate from said channel region is associated with said analog data to be stored, resulting in completion of data writing in said memory cell.

9. The method according to claim 8 further comprising the step of:

(d) erasing data in said memory cell, said erasing including at least the steps of:
    i) applying a predetermined erase voltage to said control gate,
    ii) applying said ground voltage to said source, and
    iii) applying said ground voltage to said drain to erase said memory cell, whereby charges are moved to said control gate from said floating gate, thereby erasing data from said memory cell.

10. An analog data storing apparatus having a non-volatile semiconductor memory which is electrically rewritable and erasable, said semiconductor memory device comprising:

a memory cell array having a plurality of row address lines, a plurality of column address lines, a common line and a plurality of memory cells which are selectable by said plurality of row address lines and said plurality of column address lines, each of said memory cells comprising a transistor having a control gate connected to an associated one of said plurality of row address lines, a source connected to an associated one of said plurality of column address lines, a drain connected to said common line, and a floating gate, said floating gate operating to accumulate charge and being capacitively coupled to said source and said control gate;

enabling means for selectively applying a predetermined first write voltage to one of a plurality of row address lines, selectively applying a predetermined second write voltage to one of a plurality of column address lines, and applying a ground voltage to said common line to selectively enable a plurality of memory cells among said memory cells;

comparing means for comparing a first voltage associated with said analog data to be stored in each memory cell with a second voltage associated with a current flowing in said channel regions of said enabled memory cells; and stopping means for stopping applying said first write voltage or stopping applying said second write voltage when said first and second voltages differ by less than a predetermined amount.

11. An analog data storing apparatus according to claim 10, wherein said enabling means, said comparing means and said stopping means comprise:

a supply voltage generator for generating said predetermined first and second write voltages in response to a write control signal;

a row address line selector, connected to said supply voltage generator and said plurality of row address lines, for selecting one of said plurality of row address lines in response to an address signal and said write control signal and applying said predetermined first write voltage to said selected row address line;

a column address line selector, connected to said plurality of column address lines and said common line, for selecting one of said plurality of column address lines in response to an address signal and said write control signal; and a write controller, connected between said supply voltage generator and said column address line selector and responsive to said predetermined second write voltage and said analog data to be stored in memory cells, for supplying said second write voltage to said column address line selected by said column address line selector, said write controller being selectively connected to said common line to compare a first voltage associated with said analog data with a second voltage associated with a current flowing through said channel of an associated memory cell when said associated memory cell is enabled by said predetermined first and second write voltages and to stop applying first write voltage or said second write voltage when said first and second voltages differ by less than a predetermined amount.

12. An analog data storing apparatus according to claim 11, wherein said write controller includes:

a first current detector for detecting a first current corresponding to analog data to be stored in a memory cell;

a second current detector, connected to said common line, for detecting a second current flowing in said channel of said memory cell;

a comparing circuit, connected to said first and second current detectors, for comparing said first voltage associated with said detected first current with said second voltage associated with said detected second current, and for outputting a predetermined signal when said first and second voltages differ by less than a predetermined amount; and a stop circuit, connected to said selected column address line and said comparing circuit, for stopping supplying said first write voltage or second write voltage in response to said predetermined signal.

13. An analog data storing apparatus according to claim 12, wherein said first current detector receives said analog data and includes first and second series-connected current limiting elements, with a first node formed between said first and second current limiting elements;

wherein said second current detector includes third and fourth current limiting elements connected in series between said common line and ground, with a second node formed between said third and fourth current limiting elements;

wherein said comparing circuit includes a comparator for comparing said first voltage associated with a current flowing through said first node with said second voltage associated with a current flowing through said second node, and for outputting said predetermined signal; and wherein said stop circuit includes a switch element which is turned on in response to said predetermined signal.

14. An analog data storing apparatus according to claim 11, wherein said write controller includes:

a first transistor connected to said column address line selected by said column address line selector;

a first resistor connected to said first transistor, with a first node formed between said first transistor and said first resistor;

a second resistor connected in series to said first resistor, with a second node formed between said first and second resistors to which said predetermined second write voltage generated by said supply voltage generator is input; and a second transistor connected to said second resistor, with a third node formed between said second transistor and said second resistor, said first transistor further having a control terminal connected to said third node, and said second transistor further having a control terminal connected to said first node.

\* \* \* \* \*